(12) United States Patent
Yeager et al.

(10) Patent No.: US 6,784,695 B1
(45) Date of Patent: Aug. 31, 2004

(54) DOMINO CIRCUIT TOPOLOGY

(75) Inventors: Hans L. Yeager, El Dorado Hills, CA (US); Scott E. Siers, Elk Grove, CA (US); Brian T. Ormson, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/369,547

(22) Filed: Feb. 21, 2003

(51) Int. Cl.[7] .............................................. H03K 19/096
(52) U.S. Cl. .............................. 326/98; 326/95; 326/83; 365/230.06
(58) Field of Search .............................. 326/93, 95, 98; 327/208–212, 214, 215, 224, 225

(56) References Cited

U.S. PATENT DOCUMENTS

| | | | |
|---|---|---|---|
| 5,677,641 A | * | 10/1997 | Nishio et al. ............... 326/121 |
| 5,917,355 A | * | 6/1999 | Klass .......................... 327/208 |
| 6,204,696 B1 | * | 3/2001 | Krishnamurthy et al. ..... 326/98 |
| 6,246,266 B1 | * | 6/2001 | Bosshart ...................... 326/98 |
| 6,346,831 B1 | * | 2/2002 | Krishnamurthy et al. ..... 326/98 |

* cited by examiner

*Primary Examiner*—Vibol Tan
(74) *Attorney, Agent, or Firm*—Fleshner & Kim, LLP

(57) ABSTRACT

A domino circuit topology that includes a dynamic circuit, logic circuit, and static circuit. The domino circuit includes a dynamic circuit, logic circuit, and static circuit coupled through a central node. The dynamic circuit includes a pre-charge circuit and a keeper circuit for pre-charging the central node and keeping the central node at its current voltage level. The static circuit provides a static output for the domino circuit. The logic circuit provides logical functions for input signals. In addition, the domino circuit can include an isolation transistor coupled between the central node and the logic circuit.

24 Claims, 12 Drawing Sheets

US 6,784,695 B1

DOMINO CIRCUIT TOPOLOGY

BACKGROUND OF THE INVENTION

1. Field of the Invention

Present invention relates to logic circuitry. In particular, the present invention relates to a domino logic circuit.

2. Background of the Related Art

In semiconductor devices, the operational frequency of the devices are constantly increasing. The increasing operational frequency due to faster clock rates lessens the time for signal evaluation. Domino logic circuits increase the speed of logic circuits. A conventional domino logic circuit includes two parts, a dynamic circuit and a static circuit coupled to the dynamic circuitry. The dynamic circuitry pre-charges an output node high when a clock signal is low and lets the input data signals cause the output to evaluate low when the clock signal is high. The dynamic circuitry is often an N-type metal oxide semiconductor (NMOS) pull-down circuitry (alternatively it can be a pull-up circuitry) that is operable to pull-down the level of a relatively weakly held pre-charged circuit node. The speed of a conventional domino logic circuit is limited by the time it takes to pre-charge the dynamic circuit node and pull-down the weakly held pre-charged node.

One solution to this problem is to reduce the physical size of the circuit elements and reduce the threshold voltages of transistors within the circuit. Unfortunately, reducing transistor threshold voltage and smaller geometry results in a higher sub-threshold leakage current in the transistors. In addition, the low threshold voltages, coupled with faster signal edges and greater noise coupling due to smaller geometry, contribute to increasingly substantial noise problems.

For instance, the voltage on a dynamic node can be degraded due to charge sharing, coupling noise, and/or charge leakage. Furthermore, supply voltage scaling requires the transistor threshold voltage to reduce in order to preserve the speed of the devices, but results in logic circuits that are more sensitive to noise.

These and other disadvantages exist in conventional circuitry.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
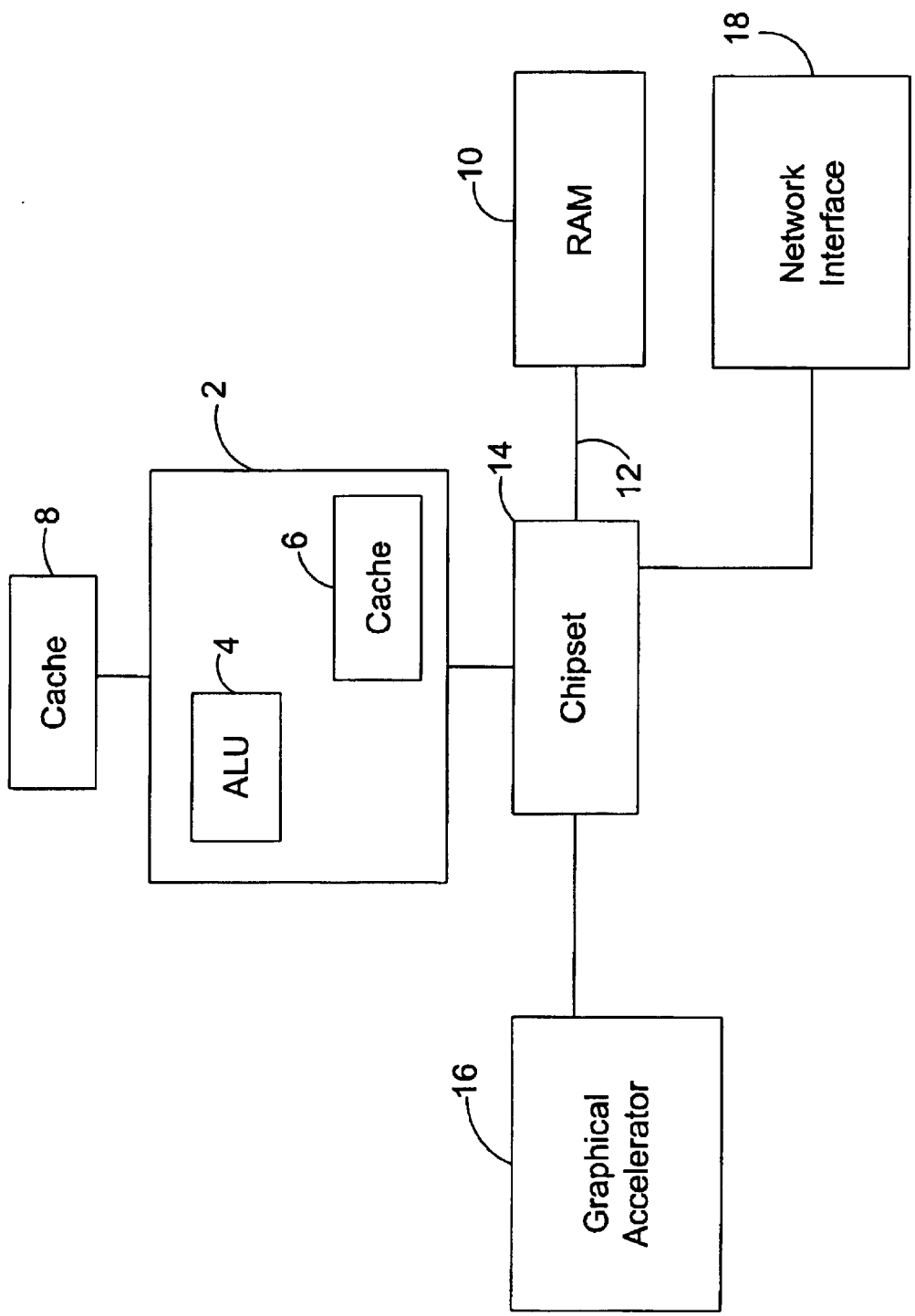
FIG. 1 illustrates an example of a computer system.

In the following detailed description of the embodiments, reference is made to the accompanying drawings that show, by way of illustration, specific embodiments in which the invention made be practiced. In the drawings, like numerals describe substantially similar components throughout the several views. These embodiments are described in sufficient detail to enable those skilled in the art to practice the invention. Other embodiments may be utilized in structural, logical, intellectual changes may be made without departing from the scope of the present invention. Moreover, it is to be understood that various embodiments of the invention, although different, are not necessarily mutually exclusive. For example, a particular feature, structure, or characteristic described in one embodiment may be included within other embodiments The following detailed description is, therefore, not to be taken in a limiting sense, in the scope of the present invention is to find only by intended claims, along with the full scope of equivalence to which such claims are entitled.

The embodiments of the present invention relate to dynamic logic circuits that are used in a vide variety of applications including microprocessors. FIG. 1 shows an exemplary illustration of a computer system. The computer system may include a microprocessor 2, which include many sub-blocks, such as an arithmetic logic unit (ALU) and on-die cache 6. Microprocessor 2 may also communicate to other levels of cache, such as off-die cache 8. Higher memory hierarchy levels such as system memory 10, are accessed via host bus 12 and chipset 14. In addition, other off-die functional units, such as graphics accelerator 16 and network interface controller 18, to name just a few, may communicate with microprocessor 2 via appropriate busses or ports.

Figure 2:
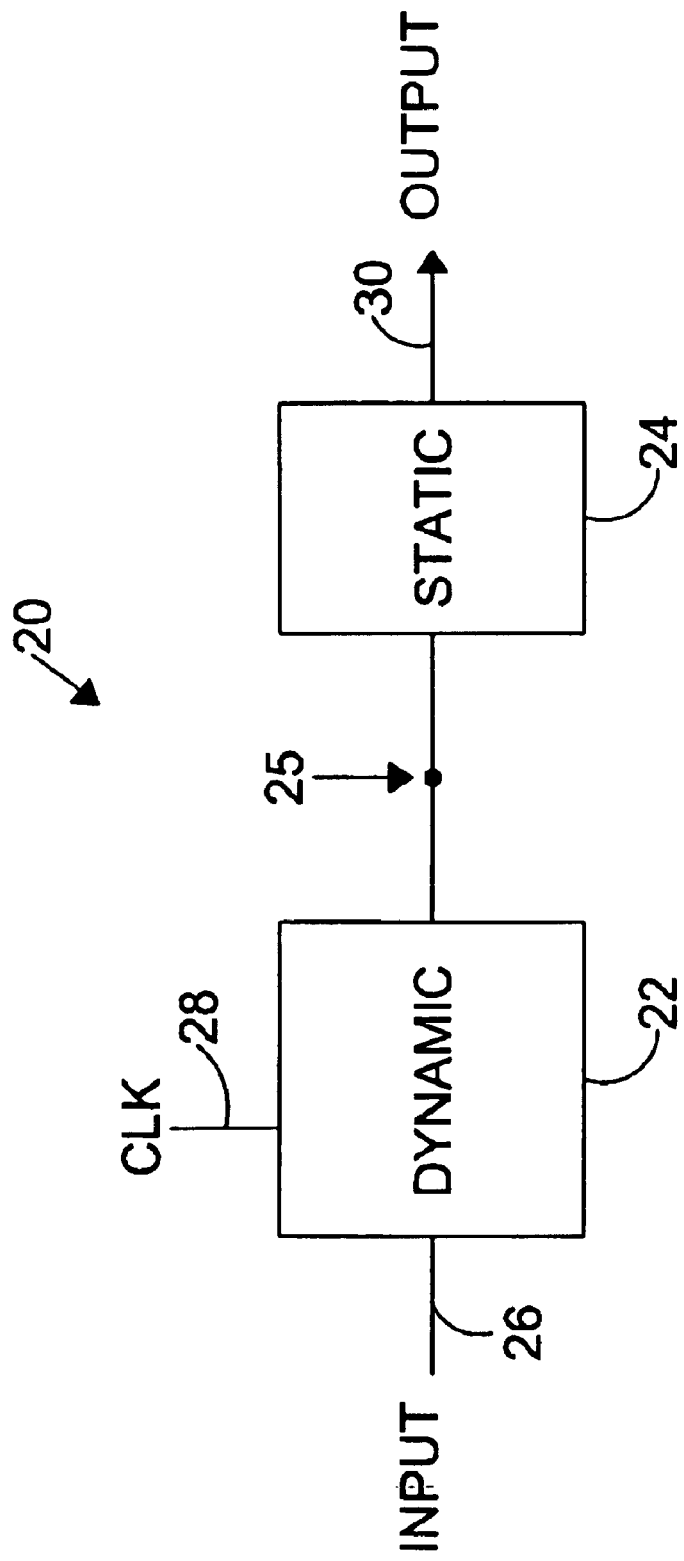
FIG. 2 illustrates a block diagram of a domino circuit.

FIG. 2 illustrates a block diagram for a domino circuit. As shown in FIG. 2, domino circuit 20 includes a dynamic circuit 22 coupled to a static circuit 24. A dynamic circuit 22 includes In input 26 and a clock signal 28. The static circuit 24 includes an output 30. Input 26 propagates through the dynamic circuit 22 when clock signal 28 is active, to the evaluation node 25. The signal 25 then propagates directly through static circuit 24 to output 30.

Figure 3A:
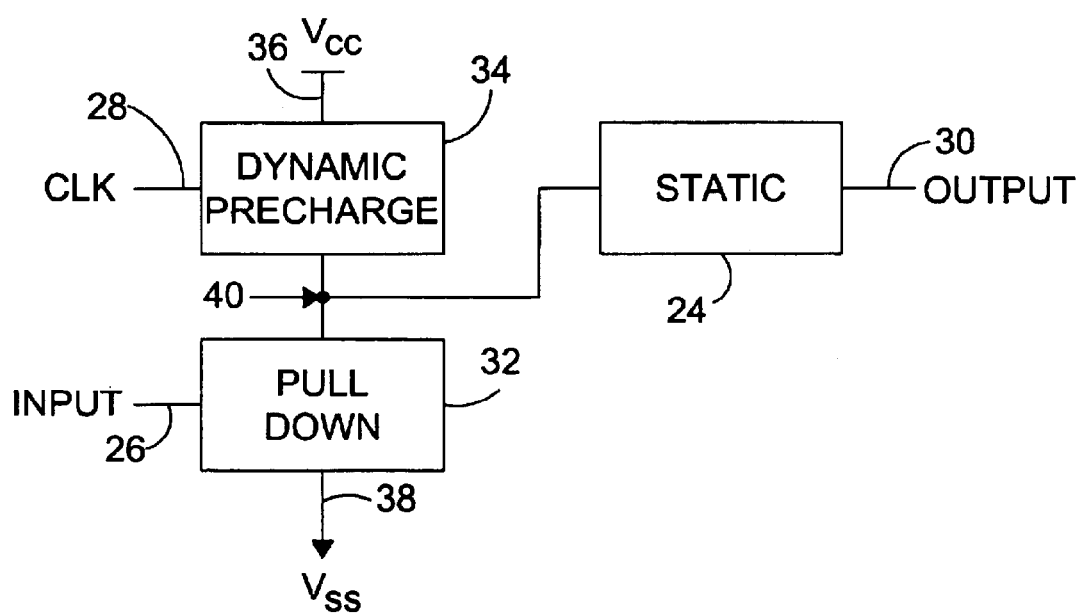
FIGS. 3(a) and 3(b) illustrate examples of domino circuits with a pull-down circuit and a pull-up circuit respectively.
Figure 3B:
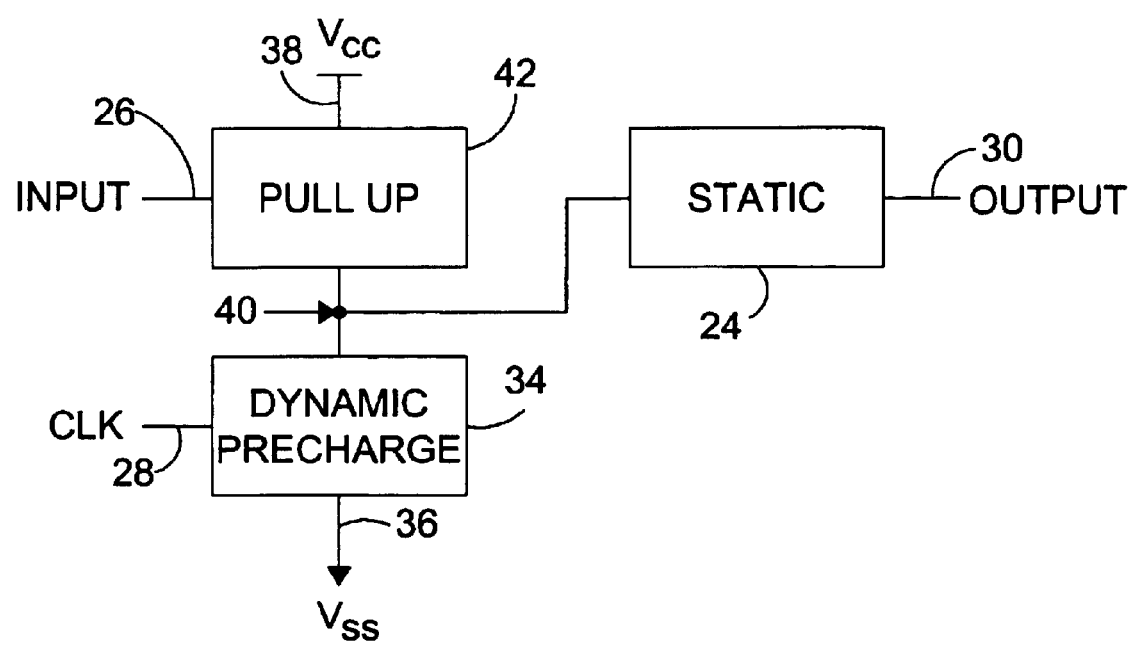

FIGS. 3A and 3B illustrate domino circuits with a pull-down circuit and a pull-up circuit respectively. FIG. 3A illustrate the domino circuit with a pull-down circuit 32. The dynamic circuit includes a dynamic pre-charge circuit 34 that has a clock input 28 and a supply voltage input 36 ($V_{cc}$). The dynamic pre-charge circuit 34 is coupled to the pull-down circuit 32 and the static circuit 24. The pull-down circuit 32 includes an input 26 and a reference voltage supply 38 ($V_{ss}$). $V_{ss}$ can be a ground terminal or other low voltage supply. The static circuit 24 includes output 30. A dynamic pre-charge circuit 34, pull-down circuit 32, and static circuit 24 are all interconnected at a dynamic node 40. A dynamic pre-charge circuit 34 pre-charges the dynamic node 40 to a pre-charge voltage. In the high phase of clock input 28, input 26 will cause the pull-down circuit 32 to evaluate node 40 to the reference voltage level (can be ground) when the logic of pull-down circuit 32 and input 26 warrants. The voltage value at the dynamic node 40 then propagates through the static circuit 24.

FIG. 3B illustrates a domino circuit with a pull-up circuit 42. The pull-up circuit 42 includes input 26 and supply voltage 38. The pull up circuit 42 is coupled to the dynamic pre-charge circuit 34 at a dynamic node 40. The dynamic pre-charge circuit 34 includes clock input 28 and reference voltage 36. Static circuit 24 includes output 30 and is coupled to the dynamic pre-charge circuit 34 and pull-up circuit 42 at the dynamic node 40. The dynamic pre-charge circuit 34 pre-charge, the dynamic node 40 to a reference voltage level (low voltage level). In the low phase of clock input 28, input 26 will cause the pull-up circuit 42 to evaluate node 40 to high voltage level (can be a supply voltage level) if warranted by input 26. The voltage level of dynamic node 40 then propagates through the static circuit 24.

Figure 4:
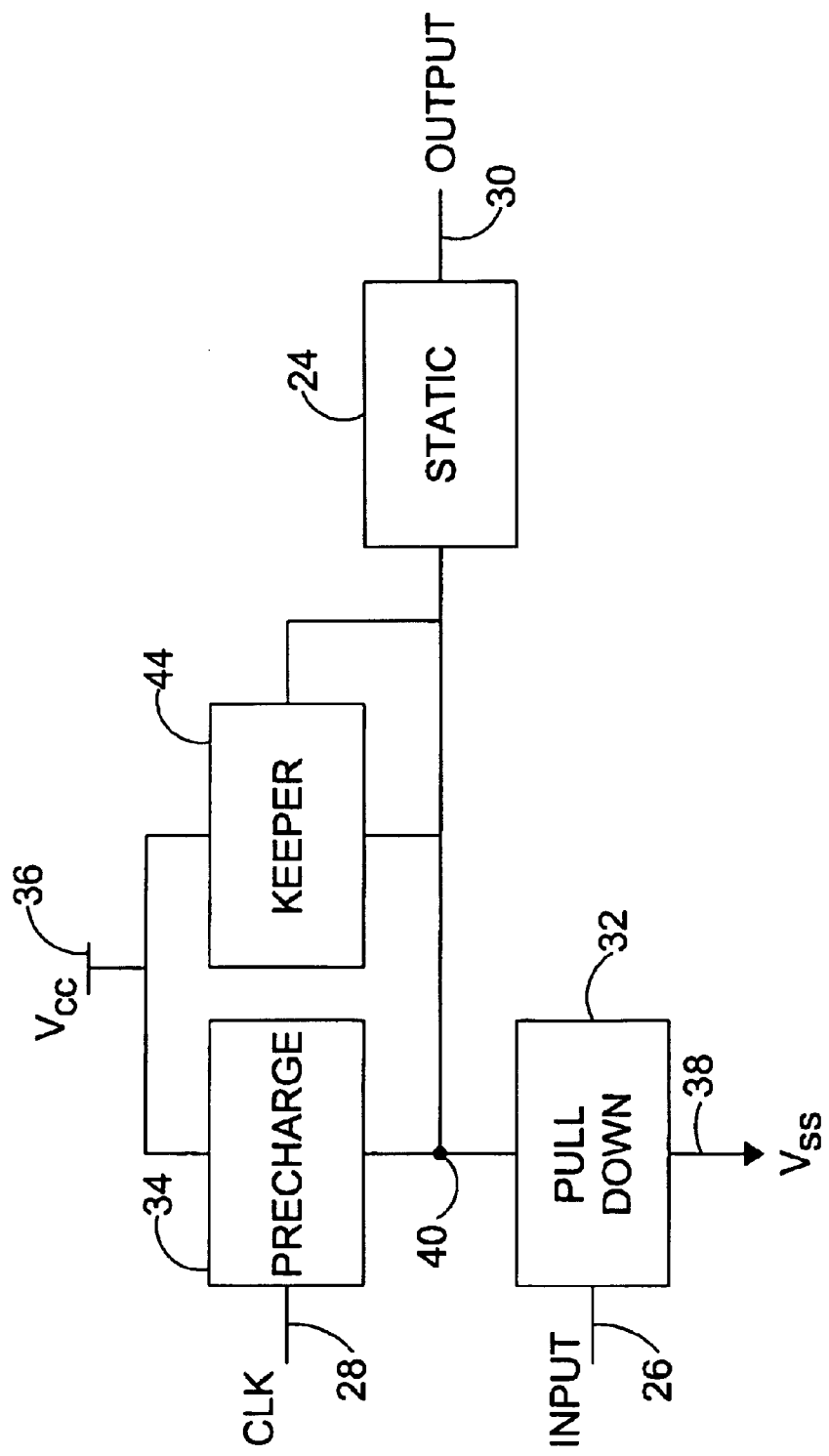
FIG. 4 illustrates a simplified block diagram of the example of a domino circuit with the pre-charge and keeper circuitry.

FIG. 4 illustrates a simple block diagram of a domino circuit with a dynamic pre-charge circuit 34, pull-down circuit 32, static circuit 24, and keeper circuit 44. Keeper circuit 44 is coupled to supply voltage 36 and dynamic node 40. Keeper circuit 44 operates to keep the voltage level imposed at dynamic node stable during an evaluation phase when the pull-down circuit 32 does not pull the voltage level down.

Figure 5:
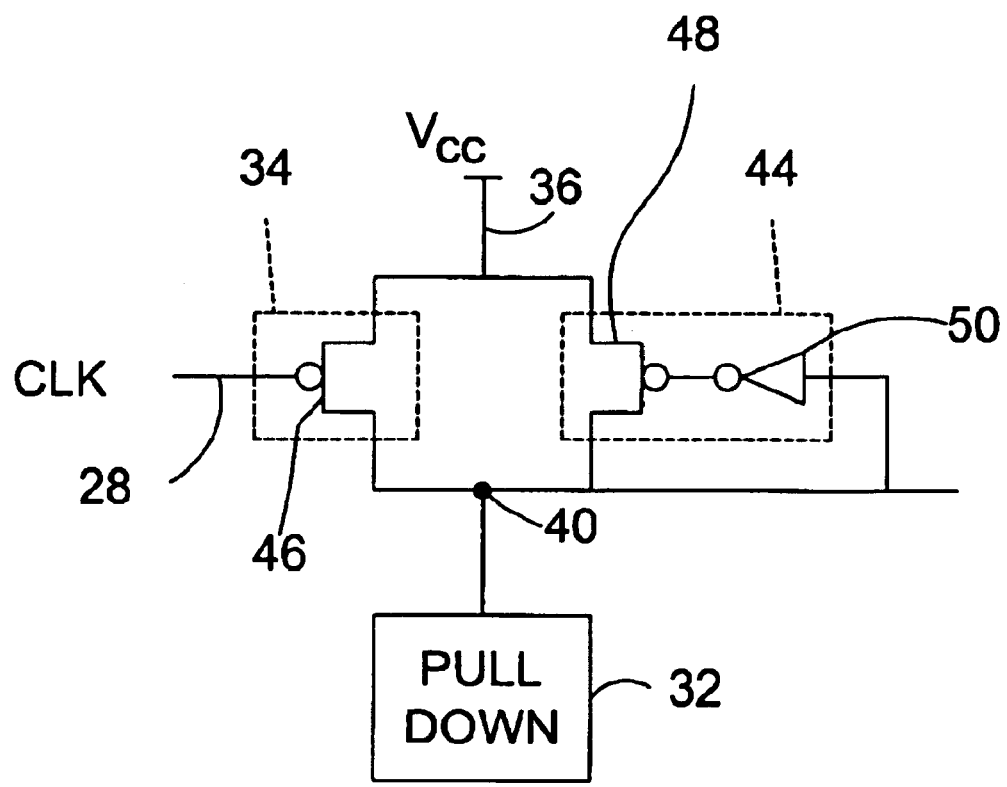
FIG. 5 illustrates additional details of an example pre-charge and keeper circuit.

FIG. 5 illustrates additional details of a pre-charge circuit 34 and keeper circuit 44. Pre-charge circuit 34 may include a P-channel metal oxide semiconductor (PMOS) transistor 46. PMOS transistor 46 has a source coupled to the supply voltage 36, a drain coupled to the dynamic node 40, and a gate coupled to the clock 28. When the clock 28 is low, dynamic node 40 is pre-charged to the supply voltage level. For each time instance, clock 28 goes high and separates the supply voltage 36 from the dynamic node 40. The keeper circuit 44 includes a PMOS transistor 48 and an inverter 50. The keeper transistor 48 includes a source coupled to the supply voltage 36, a drain coupled to a dynamic node 40, and a gate coupled to the output of keeper inverter 50. The keeper inverter 50 has an output coupled to the gate of keeper transistor 48 and an input coupled to the dynamic node 40. When the dynamic node 40 is at a high level, inverter 50 outputs a low voltage level to the gate of transistor 48. This turns transistor 48 on coupling the supply voltage 36 to the dynamic node 40, which "keeps" the dynamic node 40 at a continuously high level. When dynamic node 40 is at a low voltage level, inverter 50 outputs a high voltage to the gate of transistor 48. This turns transistor 48 off and disconnects supply voltage 36 from dynamic node 40. Transistor 48 can be much smaller and weaker than transistors in the pull-down circuit 32. With a smaller, weaker transistor 48, node 40 can evaluate low when the transistors of pull-down circuit 32 overpower transistor 48.

Figure 6:
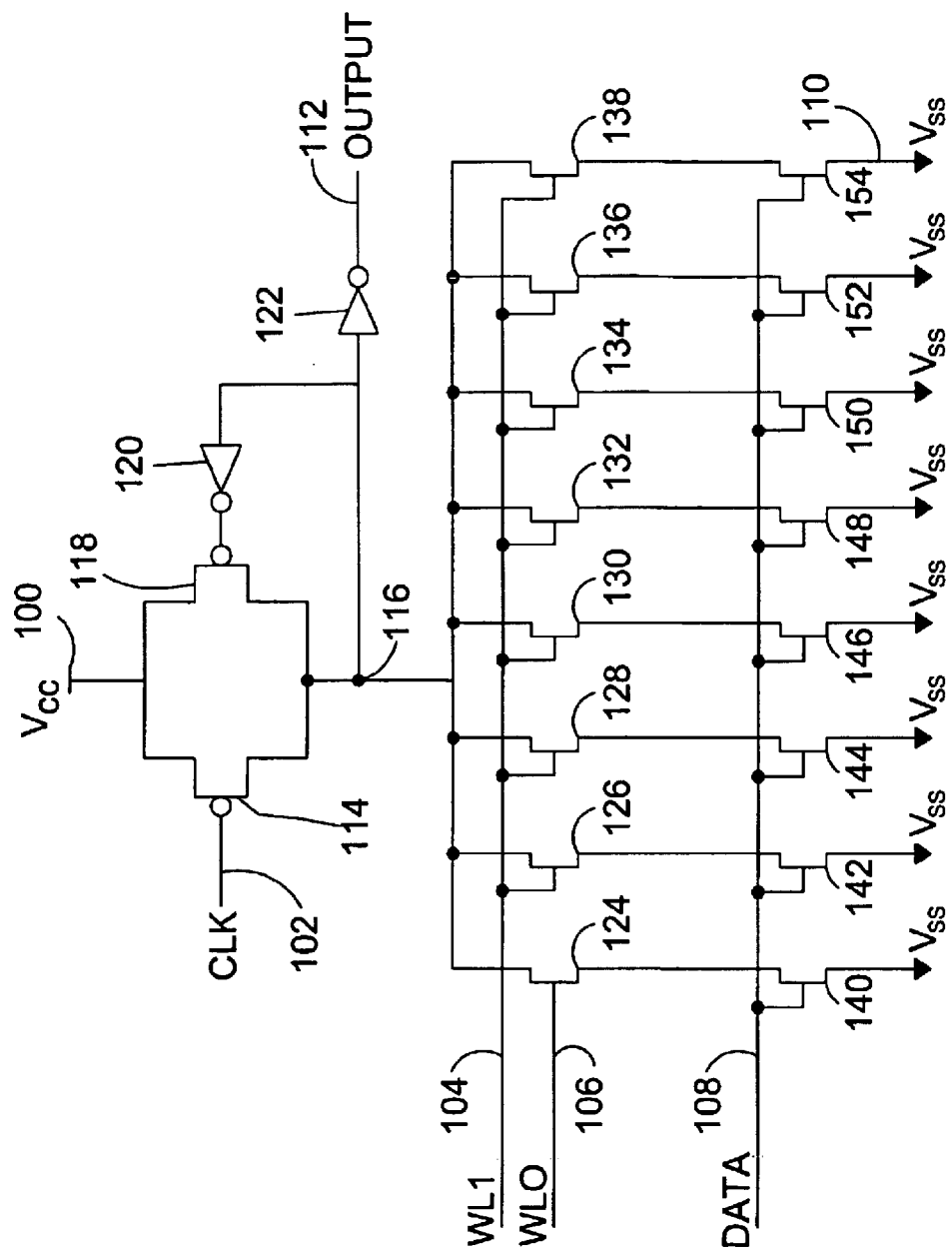
FIG. 6 illustrates a domino circuit.

FIG. 6 illustrates a domino circuit The circuit includes a supply voltage 100, clock 102, word line 104 and 106, data line 108, reference voltage 110 (can be a ground terminal) and output 112. The domino circuit includes a pre-charge transistor 114 that has a source connected to supply voltage 100, a gate connected to clock line 102, and a drain connected to node 116. The domino circuit also includes a keeper transistor 118 and keeper inverter 120. Transistor 118 has a source coupled to supply voltage 100, a gate coupled to the output of inverter 120, and a drain coupled to node 116. The inverter 120 has an input coupled to node 116 and an output coupled to the gate of transistor 118. The domino circuit also includes an output inverter 122. The inverter 122 has an input coupled to node 116 and an output coupled to output 112. The domino circuit also includes two sets of NMOS transistors, NMOS transistors 124–138 and NMOS transistors 140–154. NMOS transistor 124 has a drain coupled to node 116, a gate coupled to word line 106, and a source connected to the drain of transistor 140. Transistors 126–138 have drains coupled to node 116, gates coupled to word line 104, and sources connected to the drains of corresponding transistors 142–154. Transistors 140–154 have drains connected to the sources of corresponding transistors 124 138, gates coupled to data line 108, and sources coupled to reference voltage 110. The word lines 104 and 106, data line 108, and the two sets of transistors provide the logic structure for the domino circuit. Although FIG. 6 shows only one data line and two word lines, it should be understood that each transistor can be coupled to a separate word line or data line. For example, the logic structure can have 8 word lines and 8 data lines for inputs.

Figure 7:
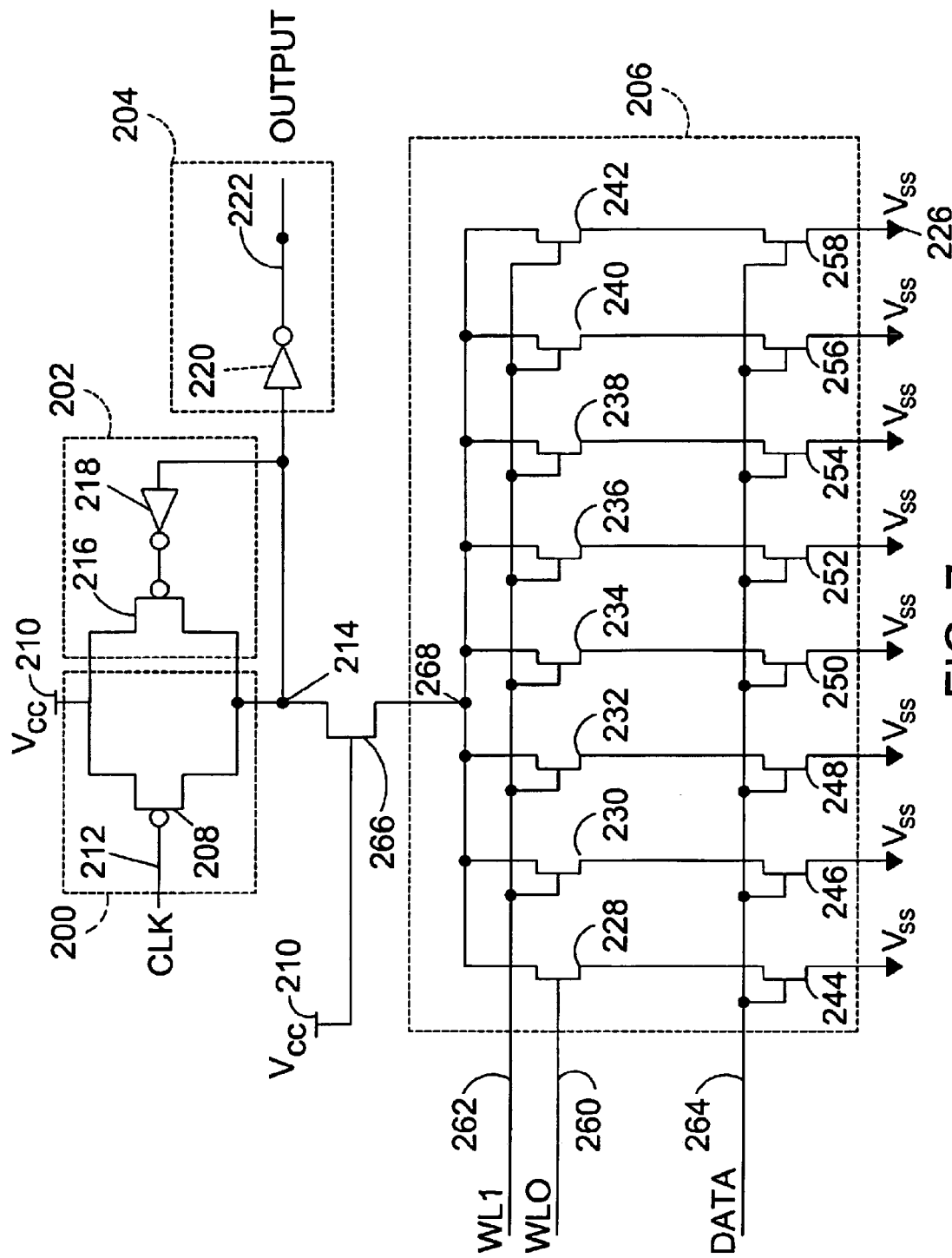
FIG. 7 illustrates a domino circuit according to one embodiment of the intention.

FIG. 7 illustrates a domino circuit with a logic structure according to one embodiment of the invention. The domino circuit includes a dynamic pre-charge circuit 200 a keeper circuit 202, a static circuit 204, and a logic circuit 206. The dynamic pre-charge circuit 200 includes a PMOS transistor 208 having a source connected to supply voltage 210, a gate connected to clock line 212 and a drain connected to node 214. The keeper circuit 202 includes a PMOS transistor 216 having a source connected to supply voltage 210, a gate connected to inverter 218, and a drain connected to node 214. The keeper circuit 202 also includes an inverter 218 that has an output connected to the gate of transistor 216 and an input connected to node 214. The static circuit 204 includes an inverter 220 having an input connected to node 214 and an output connected to Output line 222. The logic circuit 206 includes two sets of 8 NMOS transistors 228–242 and 244–258. The gate of transistor 228 is connected to a first word line 260. The gates of transistor 230–242 are connected to a second word line 262. Alternatively, each transistor 230–242 can be connected to its own word line. The gates of transistors 244–258 are connected to a data line 264. Alternatively, each transistor 244–259 can be connected to its own data line. The sources of transistor 244–258 are connected to reference voltage supply 226 (can be ground). The drains of transistors 244–258 are connected to the source of a corresponding transistor 228–242. The drains of transistors 228–242 are coupled to the source of isolation transistor 266. Isolation transistor 266 has a gate connected to supply voltage 210 and a drain coupled to node 214.

Figure 8:
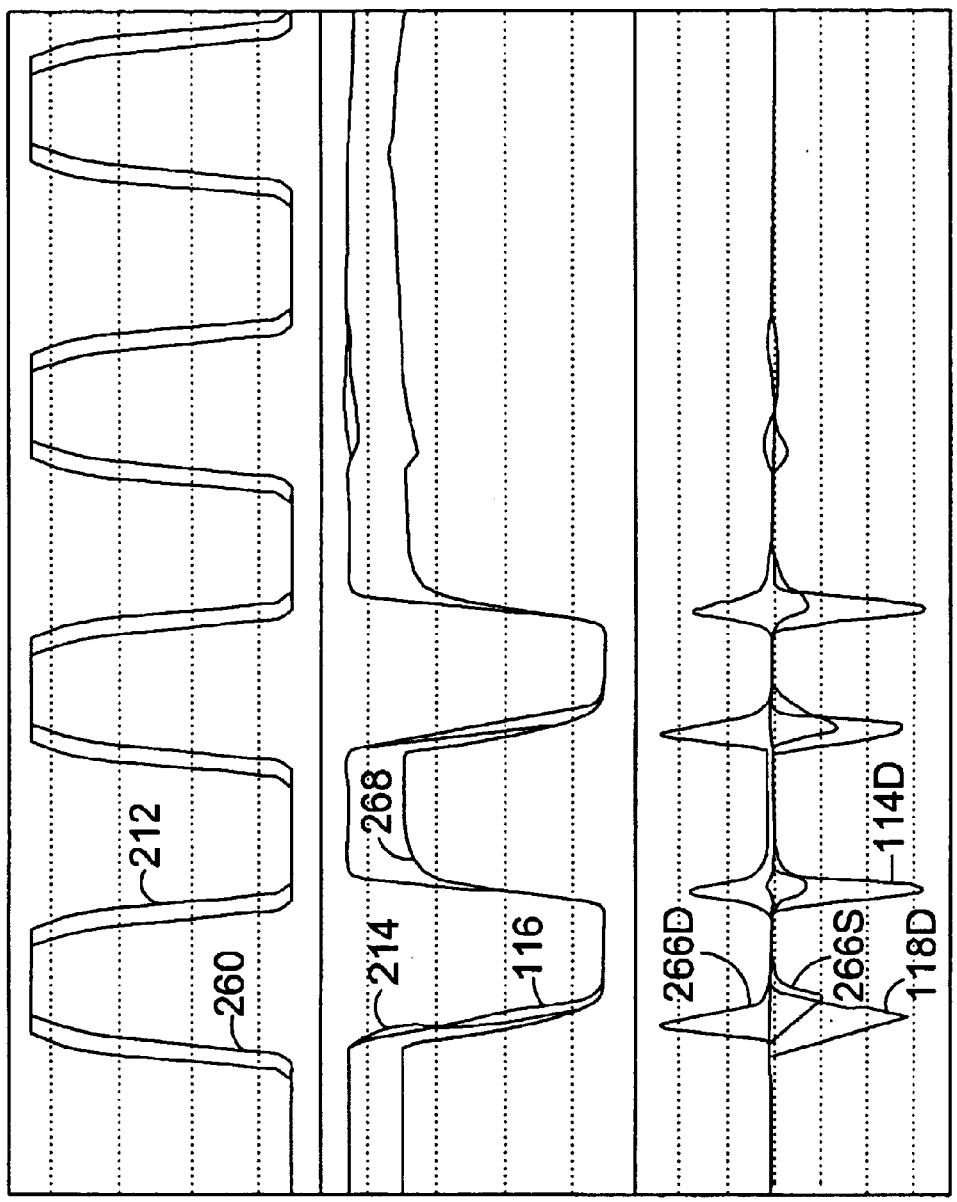
FIG. 8 illustrates functional simulation for the circuits of FIGS. 6 and 7.

FIG. 8 illustrates the functional behavior of the circuits in FIGS. 6 and 7 and a current through the PMOS pre-charging keeper devices in both circuits. The isolation transistor 266 serves as an isolation device between node 214 and a sub-node 268. Sub-node 268 is a node between the source of transistor 266 and the drains of transistors 228–242. The upper portion of FIG. 8 shows the voltage signal for the clock line 212 (and word line 260). The middle portion shows the voltage graphs for node 214, 116, and 268. The lower portion shows the current at the drain of transistor 266 (266$d$), The source of transistor 266 (266$s$), the drain of transistor 118 (118$d$), and the drain of transistor 114 (114$d$).

In the circuit of FIG. 7 the node 214 has a substantially lower capacitance incident then node 116. In the pre-charge state, transistor 266 has a very low Ids (drain source current, since the V$_{gs}$=approximately V$_{thn}$ and V$_{ds}$=approximately V$_{thn}$). Thus, when any pull-down circuit turns on, the capacitance on sub-node 268 discharges without fighting transistor 216 (keeper transistor). Transistor 216 does not start fighting until the voltage on sub-node 268 has decreased enough such that significant I$_{ds}$ (due to non-0 V$_{ds}$) can pass through transistor 266. The current delivered from transistors 114 and 118 is much greater than that through transistor 266. Furthermore, the current through transistors 208 and 216 is much lower than through transistors 114 and 118. As shown in the middle of FIG. 8, the initial transition of node 214 starts after node 116, but the slope is much better This is due to the fact short-circuit power is reduced during the evaluation phase of the domino circuit. Thus, the circuit is faster even though a device is added in series to the stack.

Figure 9:
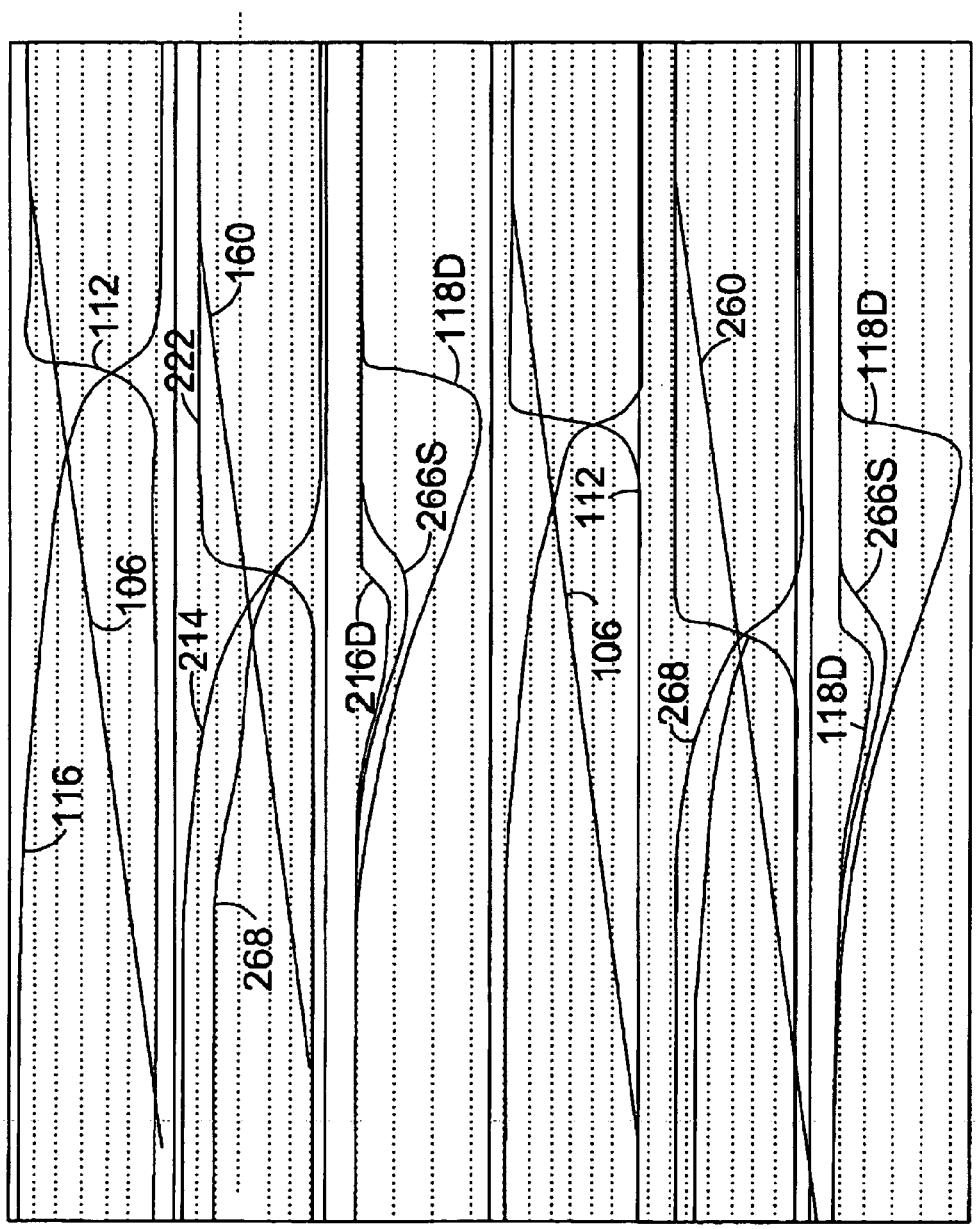
FIG. 9 illustrates the WL input ramp for triggering domino evaluation of the circuits shown in FIG. 6 and 7.

Sub-threshold leakage is exponentially dependent of V$_{ds}$. Since V$_{ds}$ across the 8 pull-down devices is reduced by approximately 33 percent (a V$_{thn}$), the leakage is reduced by approximately 50 percent. FIG. 9 shows the noise margin, which is a function of a slow voltage ramp on a single word line (WL) transistor. The top three graphs of FIG. 9 are at a normal process corner. The bottom three graphs are at a fast process corner. As can be seen, it is clear how much less contention current (supplied by the drain of 216 versus the drain of 118). Thus, the domino circuit according to one embodiment as shown in FIG. 7 will facilitate a leakage reduction in a logic structure of approximately 50% or greater. It will also reduce active and short circuit power in the domino and clock load on subsequent stages. It also has an added benefit of eliminating the need for a burn-in keeper device. The cost of these benefits is that the noise margin has been reduced in the circuit of FIG. 7.

For instance, at burn-in conditions, the supply voltage ($V_{cc}$) is elevated above normal operating conditions. Since sub-threshold leakage is exponentially related to $V_{ds}$, there is enormous leakage in burn-in. Usually so much leakage is present that the keeper PMOS device in a standard domino structure has to be very large, which degrades the performance advantage of the domino circuit. Since $V_{ds}$ is reduced by a $V_{thn}$ of the NMOS, the keeper size does not have to be so big, which helps retain the speed advantage of the domino circuit. The noise margin verses the speed/power can be adjusted by changing the skew of the feed back inverter that drives the PMOS keeper device. For example, the P/N ratio of the feed back inverter 218 can be a 2/1 ratio, which is much more conservative than is typically used in domino circuits.

According to one embodiment, the $V_{thn}$ of the NMOS transistor is leverage to provide several advantages including reducing a voltage saving for most of the capacitance required to evaluate the domino; reducing short circuit power consumption during evaluation; reducing $V_{ds}$ during steady state conditions (reducing leakage power); and merging the multiplexer function into a single domino evaluation stage. This can be accomplished without adding any extra circuitry by pre-charging node 268 (for example) through the NMOS 266.

Figure 10:
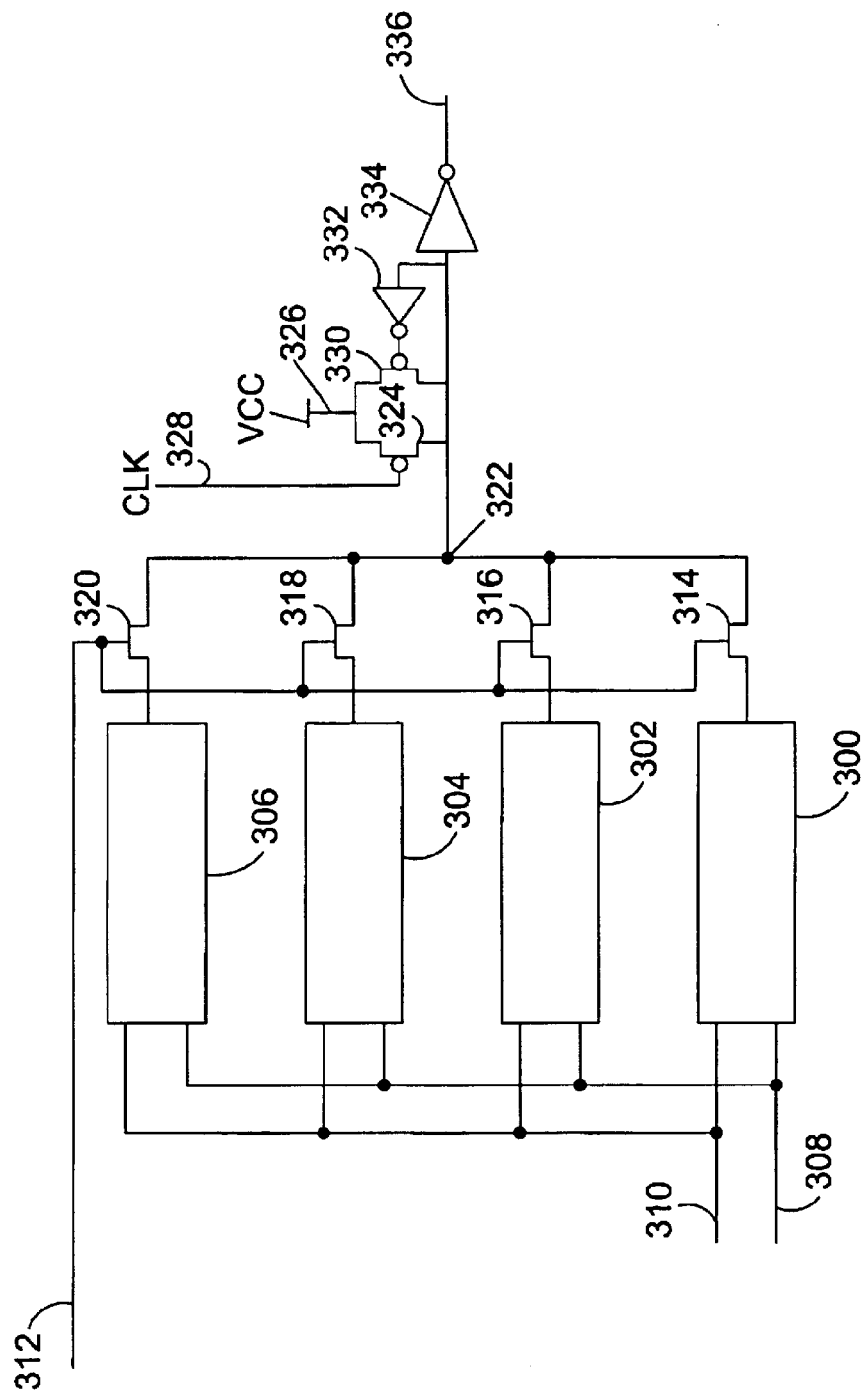
FIG. 10 illustrates a domino circuit with 4 logic circuits according to one embodiment of the invention.

FIG. 10 illustrates a circuit with 4 separate logic structures according to one embodiment of the invention. The domino circuit according to this embodiment includes four logic structures 300, 302, 304, and 306. These logic circuits can be similar to those shown in FIG. 7. Each logic circuit 300–306 includes a data line input 308 and a word line input 310. Each logic structure 300–306 is coupled to an isolation transistor 314–320 (alternatively, a single isolation transistor can be provided for all the NOR structures). The source of the isolation transistor 314–320 is connected to the output of the corresponding logic structure 300–306, the gate of isolation transistors 314–320 are coupled to the select line 312, and the drain of isolation transistor 314–320 are coupled to node 322. The circuit also includes a pre-charge and keeper circuit. The pre-charge circuit includes a PMOS transistor 324. The PMOS transistor 324 has a source connected to supply voltage 326, a gate connected to a clock line 328, and a drain connected to node 322. The keeper circuit includes a PMOS transistor 330. The PMOS transistor 330 has a source connected to supply voltage 326, a gate connected to inverter 332, and a drain connected to node 322. Keeper circuit also includes an inverter 332 with an input connected to node 322 and an output connected to the gate of transistor 330. The circuit also includes a static component including an inverter 334 with an input connected to node 322 and an output connected to output line 336.

Select line 312 can be a separate line for each isolation transistor 314–320, which will enable the circuit to access each logic circuit individually. By using separate select lines for each isolation transistor, the domino circuit can isolate the capacitance added to the node by the logic components during evaluation. This will result in faster evaluation times. In effect, separate select lines and isolation transistors for each logic circuit reduces the capacitance at node 322 during evaluation to the equivalent of an 8 input mux (assuming 8 transistor sets per logic circuit and 4 logic circuits) instead of a 32 input mux.

Figure 11:
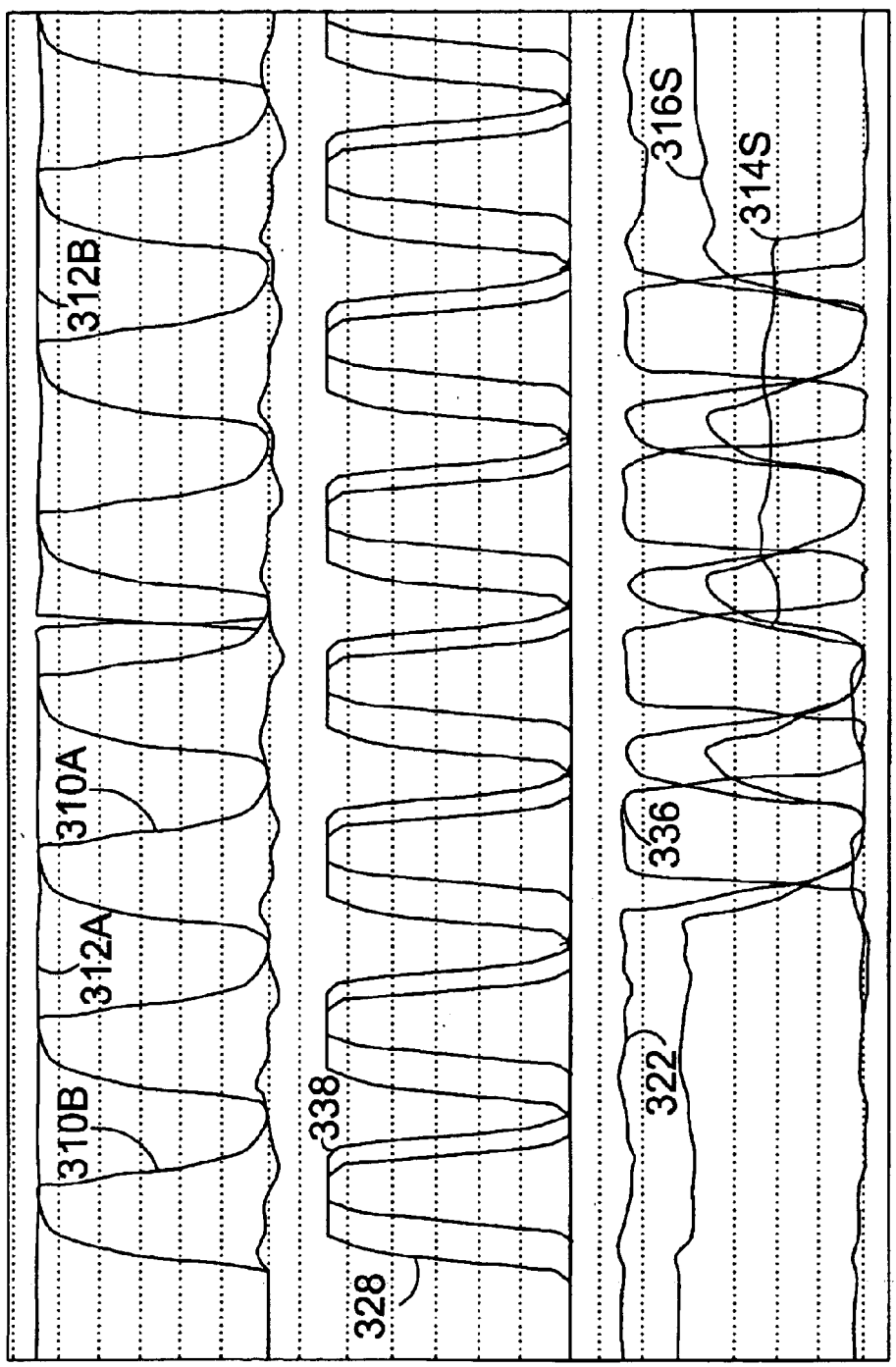
FIG. 11 illustrates functional waves for one embodiment of the invention similar to the circuit of FIG. 10.

FIG. 11 illustrates the functional waves for one embodiment similar to the circuit illustrated in FIG. 10. The embodiment illustrated in FIG. 11 includes four separate select lines 312, one select line for each isolation transistor 314–320. Each select line is coupled to the gate of respective transistors 314–320. Thus, select line 312A is coupled to the gate of transistor 314, select line 312B is coupled to the gate of transistor 316, select line 312C is coupled to the gate of transistor 318, and select line 312D is coupled to the gate of transistor 320.

In this embodiment, word line 310 includes eight separate word lines 310A–H. Each word line 310A–H goes to a transistor in each stack of transistors within each logic circuit 300–306 (the top transistor in each stack within the logic circuit). Using the logic circuit 206 in FIG. 7 for example, word line 310A would be coupled to transistor 228, word line 310B would be coupled to transistor 230, word line 310C would be coupled to transistor 232, word line 310D would be coupled to transistor 234, word line 310E would be coupled to transistor 236, word line 310F would be coupled to transistor 238, word line 310G would be coupled to transistor 240, and word line 310H would be coupled to transistor 242. Each logic circuit can have its own set of 8 word lines.

In this embodiment, data line 308 includes thirty-two separate data lines 308A1–A32. Each data line 308A1–A32 goes to a transistor in the bottom row of transistors within each logic circuit 300–306 (the bottom set within each logic circuit). Using the logic circuit 206 in FIG. 7 for example, data line 308A1 would be coupled to transistor 244, data line 308A2 would be coupled to transistor 246, data line 308A3 would be coupled to transistor 248, data line 308A4 would be coupled to transistor 250, data line 308A5 would be coupled to transistor 252, data line 308A6 would be coupled to transistor 254, data line 308A7 would be coupled to transistor 256, and data line 308A8 would be coupled to transistor 258.

In this embodiment, clock 328 is the clock signal for this domino circuit, clock signal 338 (not shown) is the clock signal for a following domino circuit stage, and intermediate node 314s–320s are nodes between the source of transistors 314–320 and logic circuits 300–306 respectively.

In this embodiment, only one of the select lines 312A–D may be active at any given time. This results in only one logic circuit 300–306 being linked to node 322 at any given time. In addition, it can be ensured chat either all the word lines 310A–H are at a logic low when clock 328 is low (the pre-charge state). During the pre-charge state, node 322 is driven to a logic high through the pre-charge transistor 324, and the intermediate node is also pre-charged through the active isolation transistor. For example, if 312D is high, then 320 is active and 320s is pre-charged to a high state voltage minus a transistor threshold voltage drop (Vt) across transistor 320. The pre-charge transistor 324 delivers the charge to both 322 and the intermediate node (320s in the example above).

Before any of the word lines 310A–H may be asserted, the pre-charge clock 328 is driven high turning off transistor 324. This is the evaluation phase of the domino circuit. During this phase the keeper transistor 330 actively (but weakly) holds node 322 at an active high level. If one of the word line signals 310A–H is asserted high AND the corresponding data signal 308A25–A32 is also high in the selected logic block (306 in the example above), then the intermediate node 320s will discharge to a logic low state.

This will also discharge node 322 to a logic low state (realizing a power savings). Then, inverter 332 flips state and turns off keeper transistor 330.

In this embodiment described above there are eight word line signals 310A–H; but there can be thirty-two word line signals 310A1–A32 or none. By using the isolation transistors (314–320), the capacitive load of only one logic circuit 300–306 would be loading node 322 instead of all four logic circuits 300–306. This allows node 322 to discharge low much faster with this topology. For example, this topology enables a 32 wide NOR to be faster than an 8 wide NOR because only 8 NMOS devices, load node 322 during evaluation Reduced voltage swing (charge) on the intermediate nodes (314s–320s) and reduced short circuit power account for the additional speed up.

Leakage is also reduced. In the traditional circuit all 32 NMOS would be attached to node 322 and all would exhibit sub-threshold leakage across the drain-source terminals. In this embodiment, only one group of 8 NMOS (in block 306 in this example) exhibit sub-threshold leakage, while the leakage through the other 24 NMOS devices in the logic blocks (300–304 in this example) has been reduced to be equal to the leakage through only 3 NMOS devices (316–320 in this example).

Additionally, active power is reduced due to lower short-circuit power and due to the fact that a smaller capacitance is charged/discharged every time the circuit evaluates. In the traditional circuit, again all 32 NMOS would be connected directly to node 322, and all this capacitance would charge/discharge to Vcc each time the inputs cause node 322 to evaluate. Since active power is proportional to $C*V^2$, the new topology has a huge benefit. The capacitance on node 322 is greatly reduced. Furthermore, inside the logic block only the capacitance of 8 NMOS will evaluate (instead of 32), and because only one of nodes 314s–320s (the one selected) can pre-charge to Vcc–Vt (Vt=the threshold voltage of the transistor). Thus, the new topology reduces the capacitance by approximately 75% (new capacitance =0.25*old capacitance on node 322). It also reduces the voltage swing on the intermediate node by a substantial amount (depending on process parameters) due the threshold voltage of the NMOS isolation devices. Suppose Vt is approximately equal to 30% of Vcc; then the voltage swing on the intermediate nodes is only 70% as much as it would be without this topology. In this example, the new topology reduces the active power consumed to be 12.5% $\{0.25*C*(0.70*Vcc)^2\}$ of the power that would be consumed without this topology. This is an 87.5% reduction in active power not including short circuit power savings. Voltage saving reduction on this capacitance is huge because active power is proportional to the square of voltage swing. Thus, this embodiment achieves a 75% reduction in leakage and more than 87.5% reduction in active power while improving speed.

The foregoing description details an example of one type of logic structure. However, the logic circuit can be any type of logical circuit for the pull-up or pull-down circuit. In addition, each transistor of the logic circuit can have its own word or data line input. Also, the circuit shown in FIG. 10 can include more or less than 4 separate logic circuits. In addition, the keeper inverter and output inverter are shown as separate inverters, but they can be replaced with a single inverter whose output is the static output as well as the gate input for the keeper transistor.

The preceding description describes a dynamic node, which can also be described as an evaluation node. In addition, the isolation transistor between the dynamic node and the logic circuit has been shown as a NMOS transistor with a gate coupled to a supply voltage. It should be understood that the gate of the isolation transistor can be coupled to any input such as system supply voltage, output from another logic circuit, or an input line etc. The isolation transistor can also be a PMOS transistor. For a pull-down circuit, the isolation transistor is preferably a NMOS transistor. For a pull-up circuit, the isolation transistor is preferably a PMOS transistor.

The description has described a dynamic circuit coupled to a static output circuit. However, it should be understood that the static output circuit is optional. If the output circuit includes an inverter, for example, the domino circuit can be connected to (feed) another domino circuit of the same type. If the output circuit does not include an inverter, for example, the domino circuit can be connected to (feed) another domino circuit of a different type. For example, a zipper domino alternates pull-up logic, pull-down logic, pull-up logic, pull-down logic etc. Thus, a zipper domino is preferably implemented without a static output circuit (inverter in this case).

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A circuit, comprising:
    a dynamic circuit that pre-charges a node;
    a plurality of logic circuits coupled to the dynamic circuit through the node, the plurality of logic circuits to perform a logic operation; and
    a plurality of isolation transistors coupled between the plurality of logic circuits and the node.

2. The circuit of claim 1, wherein the dynamic circuit further comprises a pre-charge circuit and a keeper circuit.

3. The circuit of claim 2, wherein the pre-charge circuit comprises a pre-charge transistor coupled between a supply voltage and the node, and the keeper circuit comprises a keeper transistor and an inverter coupled between the supply voltage and the node.

4. The circuit of claim 2, wherein the pre-charge circuit comprises a pre-charge transistor having a source coupled to a supply voltage, a gate coupled to a clock signal, and a drain coupled to the node; and the keeper circuit comprises a keeper transistor having a source coupled to the supply voltage, a drain coupled to the node, and a gate coupled to an inverter, the inverter is coupled between the keeper transistor gate and the node.

5. The circuit of claim 1, further comprising an inverter having an input coupled to the node and an output coupled to a static circuit output.

6. The circuit of claim 1, wherein each of the logic circuits comprises a transistor having a gate coupled to an input, a source coupled to a reference voltage, and a drain coupled to the transistor.

7. The circuit of claim 1, wherein each of the plurality of logical circuits corresponds with one isolation transistor coupled between the logical circuit and the node.

8. The circuit of claim 1, further comprising an inverter coupled between the node and the output.

9. A circuit, comprising:
    a dynamic circuit that pre-charges a node;
    a logic circuit coupled to the dynamic circuit through the node, the logic circuit to perform a logic operation; and
    a transistor coupled between the logic circuit and the node, wherein the logic circuit further comprises:

a first plurality of transistors, each of the first plurality of transistors having a gate connected to a first input and a drain connected to the transistor; and a second plurality of transistors, each of the second plurality of transistors having a gate connected to a second input, a source connected to a reference voltage, and a drain connected to a source of one of the first plurality of transistors.

10. The circuit of claim 9, wherein the transistor has a gate coupled to a supply voltage.

11. The circuit of claim 9, wherein the transistor is an isolation transistor.

12. The circuit of claim 9, wherein the transistor has a drain connected to the node, a source connected to the logic circuit, and a gate connected to a supply voltage.

13. The circuit of claim 9, wherein the transistor is a NMOS transistor having a drain coupled to the node, a source coupled to the logic circuit, and a gate coupled to a supply voltage.

14. The circuit of claim 9, wherein the transistor is a NMOS transistor and the logic circuit is a pull-down logic circuit.

15. The circuit of claim 9, wherein the transistor is a PMOS transistor and the logic circuit is a pull-up logic circuit.

16. A system comprising:

a die comprising a microprocessor; and an off-die component in communication with the microprocessor;

wherein the microprocessor comprises:

a dynamic circuit that pre-charges a node;

a logic circuit coupled to the dynamic circuit through the node, the logic circuit performs a logic operation;

a transistor coupled between the logic circuit and the node; and a static circuit coupled to the node and an output, the static circuit holds the output in a static state, wherein the logic circuit further comprises:

a first plurality of transistors, each of the first plurality of transistors having a gate connected to a first input and a drain connected to the transistor; and a second plurality of transistors, each of the second plurality of transistors having a gate connected to a second input, a source connected to a reference voltage, and a drain connected to a source of one of the first plurality of transistors.

17. The system of claim 16, wherein the transistor has a gate coupled to a supply voltage.

18. A domino circuit topology, comprising:

a plurality of logic circuits that perform a logic operation;

a plurality of isolation transistors each coupled between a node and a respective one of the plurality of logic circuits;

a first transistor coupled between a first voltage source and the node, the first transistor coupling the first voltage source to the node during a first phase;

a second transistor coupled between the first voltage source and the node, the second transistor coupling the first voltage source to the node during a second phase; and a third transistor coupled between the plurality of logic circuits and the node, the third transistor coupling the plurality of logic circuits to the node during the second phase.

19. The circuit of claim 18, wherein each of the plurality of logic circuits is coupled to a reference voltage source.

20. The circuit of claim 18, wherein each of the plurality of isolation transistors is coupled to a select line that selectively operates the isolation transistor to couple the respective one of the plurality of logic circuits to the node.

21. The circuit of claim 18, wherein each of the plurality of isolation transistors has a drain connected to the node, a source connected to the respective one of the plurality of logic circuits, and a gate connected to an input.

22. The circuit of claim 21, wherein each of the plurality of isolation transistors is a NMOS transistor having a drain coupled to the node, a source coupled to the respective one of the plurality of logic circuits, and a gate coupled to a select line.

23. The circuit of claim 18, wherein the first transistor has a source coupled to the first voltage source, a gate coupled to a clock signal, and a drain coupled to the node; and the second transistor has a source coupled to the first voltage source, a drain coupled to the node, and a gate coupled to an inverter, the inverter is coupled between the second transistor gate and the node.

24. A domino circuit topology, comprising:

a logic circuit that performs a logic operation;

a first transistor coupled between a first voltage source and a node, the first transistor coupling the first voltage source to the node during a first phase;

a second transistor coupled between the first voltage source and the node, the second transistor coupling the first voltage source to the node during a second phase; and a third transistor coupled between the logic circuit and the node, the third transistor coupling the logic circuit to the node during the second phase, wherein the logic circuit further comprises:

a first plurality of transistors, each of the first plurality of transistors having a gate connected to a first input and a drain connected to the third transistor; and a second plurality of transistors, each of the second plurality of transistors having a gate connected to a second input, a source connected to a reference voltage source, and a drain connected to a source of one of the first plurality of transistors.

* * * * *